United States Patent [19]

Morgenthaler et al.

[11] 4,152,676
[45] May 1, 1979

[54] ELECTROMAGNETIC SIGNAL PROCESSOR FORMING LOCALIZED REGIONS OF MAGNETIC WAVE ENERGY IN GYRO-MAGNETIC MATERIAL

[75] Inventors: Frederic R. Morgenthaler, Wellesley Hills; Dale A. Zeskind, Cambridge, both of Mass.

[73] Assignee: Massachusetts Institute of Technology, Cambridge, Mass.

[21] Appl. No.: 761,835

[22] Filed: Jan. 24, 1977

[51] Int. Cl.² .................. H01P 1/34; H01P 1/18; H01P 1/20

[52] U.S. Cl. .................. 333/24.1; 333/161; 333/202; 333/204

[58] Field of Search .................. 333/1.1, 17 L, 24.1, 333/24.2, 30 M, 31 R, 73 R, 73 S

[56] References Cited

U.S. PATENT DOCUMENTS

| | | | |
|---|---|---|---|
| 3,309,628 | 3/1967 | Olson | 333/30 R |
| 3,444,484 | 5/1969 | Bierig | 333/24.1 X |
| 3,585,531 | 6/1971 | Degenford et al. | 333/10 X |
| 3,671,888 | 6/1972 | Szente et al. | 333/73 R |
| 3,864,647 | 2/1975 | Bongianni | 33/30 M |
| 3,935,550 | 1/1976 | Adam et al. | 333/30 M X |
| 4,027,253 | 5/1977 | Chiron et al. | 333/1.1 |
| 4,050,038 | 9/1977 | Noguchi et al. | 333/24.2 X |

OTHER PUBLICATIONS

Morganthaler, *New Types of Very Narrow Resonance Microwave YIG Filters*, The M. & Q. Magnetics Group, Dept. of E.E. & Computer Science, M.I.T.

*Primary Examiner*—Paul L. Gensler
*Attorney, Agent, or Firm*—Arthur A. Smith, Jr.; Robert Shaw

[57] ABSTRACT

A signal processing filter wherein electromagnetic wave energy is coupled into a magnetic material at a first region of the surface of the magnetic material and is coupled from the material at a second region of the surface after having propagated within the material as magnetic wave energy. The filter parameters serve to confine the electromagnetic wave energy to a small, localized region of the magnetic material and regional confinement of the magnetic wave energy is also achieved.

53 Claims, 14 Drawing Figures

ELECTROMAGNETIC SIGNAL PROCESSOR FORMING LOCALIZED REGIONS OF MAGNETIC WAVE ENERGY IN GYRO-MAGNETIC MATERIAL

The Government has rights to this invention pursuant to Grant No. 7420857-ENG and Institutional Patent Agreement No. 0010, awarded by the National Science Foundation.

The present invention relates to devices operable to process (e.g., filter and/or delay as a function of frequency) electromagnetic wave energy.

By way of background, attention is called to the following U.S. Patents of the inventor Morgenthaler: Nos. 3,895,324; 3,811,941; 3,609,596; and 3,530,302. See also an application for Patent Ser. No. 634,676, filed Nov. 24, 1975 (Morgenthaler).

Some aspects of the invention are contained in the Master's thesis of the inventor Zeskind entitled "Localized Ferromagnetic Resonance in Non-Uniform Magnetic Fields," deposited in the M.I.T. library system Apr. 2, 1976; the work discussed in the thesis was done under the supervision of the inventor Morgenthaler. See also a writing by said Morgenthaler entitled "New Types of Very Narrow Resonance Microwave YIG Filters" that is part of the file history in this application. Both the thesis and the Morgenthaler writing may be used to augment this specification and large parts of both appear herein.

Magnetic resonance is normally very much broadened if a ferrimagnetic sample is immersed in a spatially non-uniform field. Experimentalists measuring fundamental resonance parameters take great pains therefore to employ ellipsoidal sample shapes (usually small spheres) that are positioned in fields of very high uniformity. Because surface roughness is known to cause scattering from the uniform mode to degenerate spin waves of short wavelengths, thereby increasing the resonance linewidth, additional effort is expended in polishing the surfaces to optical tolerances.

Commercial manufacturers of tunable microwave, yttrium iron garnet (YIG) filters avail themselves of this knowledge and employ uniformly magnetized, highly polished spherical single crystals in their designs.

From this perspective, it is therefore very remarkable that extremely sharp resonances of a highly localized character have been recently observed (and are later discussed herein) in single crystal YIG rectangular slabs that encounter highly nonuniform demagnetization fields due to the non-ellipsoidal shape. One view of the newly discovered high Q resonance is that magnetostatic mode patterns are formed for which the resonant energies are highly confined near certain regions or "tracks" within the crystal that allow wave propagation along them. (The term "track", as used herein, denotes or represents the means creating a path (not necessarily closed on itself) of propagating magnetic wave energy within a magnetic material.) If the mode amplitudes are very small at the edges and corners of the sample, surface scattering (which one would expect to be enormous) is largely prevented; consequently the Q of the resonance is governed primarily by the intrinsic linewidth of the bulk crystal together with normal circuit loading considerations. In effect appropriately designed magnetic field profiles approximate surfaces of discontinuity where there are no actual surfaces; surface wave propagation at such apparent surfaces is believed to be free from many of the drawbacks and loss mechanisms encountered at true (i.e., exterior) surfaces—and work done for present purposes indicates such to be the case.

As herein discussed in some detail, highly localized, unusually sharp resonances have been observed in microwave coupling between closely spaced antennas on the surface of a single crystal YIG slab. Loaded-Q (also known as device Q) has been measured to be as high as 1400 at 2.5 GHz. The resonances are magnetically tunable and therefore should prove useful in a variety of microwave filter applications. The present inventors hypothesize that the resonances result from the confinement of the mode energies to certain regions of high dc field gradient within the crystal. These "gradient-bound modes" propagate along or near apparent internal "surfaces" without experiencing many of the drawbacks and loss mechanisms encountered at true surfaces. The Q of the resonance is therefore, as above indicated, primarily a result of the intrinsic linewidth of the bulk crystal along with normal microwave circuit loading considerations.

Spatially localized high-Q modes of ferromagnetic resonance have been observed in rectangular slabs of single crystal yttrium iron garnet (YIG), with dc magnetic field applied perpendicular to the plane of the slabs. Surprisingly, despite the very nonuniform demagnetizing field caused by the non-ellipsoidal sample geometry, an unusually narrow resonance was observed in microwave coupling between two closely spaced parallel stripline antennas on the same surface of the YIG slab. The antennas are designed to confine electromagnetic excitation and sensing to small regions of the crystal surface relative to the crystal dimensions.

With crystal dimensions of 4.8 mm×4.1 mm×0.4 mm and antenna separation of 0.3 mm (antennas located along the center line of the slab) the resonance (in a non-optimized structure) is characterized by a half-power bandwidth of 1.8 MHz at 2.5 GHz with an insertion loss through the crystal of less than 10 db. The resonance center frequency is tunable over the range 2.2 to 3.0 GHz by changing dc bias field magnitude. Spatially localized points of resonance exhibit symmetry about the middle of the crystal with maximum response occurring at the midplane. Half-power spatial linewidths are approximately 0.06 mm.

The interpretation of the newly discovered high-Q resonance, as indicated above, is that localized magnetic mode patterns are formed in which the resonance energies are guided or confined by regions of high dc field gradient within the crystal. In the work cited above, the localization and desirable mode characteristics were fortuitous. However, an important teaching contained herein is that by appropriately designing internal magentic field profiles, one can create and control magnetic field gradients in such a manner that mode confinement and guiding of pre-specified character can be forced to occur. Magnetic waves bound or guided by such gradients can be made to follow appropriate propagation paths or tracks with controlled group velocity and wavelength. As above stated, if the mode amplitudes are very small at the edges and corners of the sample, surface scattering is largely prevented; consequently the Q of the resonance is governed primarily by the intrinsic linewidth of the bulk crystal together with normal circuit loading considerations. The experimental results reported above are modeled using an oval track concept which results from the naturally occurring internal magnetic field profile of the rectangular YIG slab. However, should later experiments prove that modified mode patterns pertain, no important alterations in the present inventive concept will occur.

The planar geometry of the YIG slab herein described in combination with photolithographically derived surface antennas make feasible the development of a totally integrated monolithic filter.

In existing YIG filter concepts all portions of each magnetic element resonate in phase (the uniform precession mode). Such modes require uniform internal dc fields usually obtained by using spherical or thin film samples. In contrast, the device herein disclosed offers the possibility, through appropriate field shaping and localized excitation, of combining several separate effective filter elements in one bulk single crystal sample. These effectively distinct elements may be tuned to the same or different frequencies. The resonance Q of such filters should reflect the linewidth of the bulk crystal which is normally much narrower than that of prior art YIG thin films. Additionally, overall device Qs may well exceed those commonly obtained with commercial sphere filters, if results comparable to the values thus far observed are obtained.

Accordingly it is an object of the present invention to provide high Q magnetically tunable filters for electromagnetic energy.

A further object is to provide such filter using a crystal of non-ellipsoidal geometry.

A further object is to provide a high Q filter device in which several separate filters can be embodied within a single magnetic crystal.

A still further object is to provide a device with many inputs and many outputs for processing multi-frequency signals.

Another object is to provide the non-linear function of signal limiting above a certain threshold power.

Another object is to provide signal processors of a more general nature, including delay lines, and to provide such processors in other than slab form, that is, in any form (including thin films and spheres) wherein localized excitation and nonuniform dc magnetic field and field gradient are employed, in combination, to process magnetic wave energy confined within a crystal.

These and still further objects are addressed hereinafter.

The foregoing objects are achieved in a device for processing electromagnetic wave energy, that comprises a magnetic material adapted to support propagating magnetic wave energy, that is, a gyromagnetic material such as, for example, YIG. The material is one in which electromagnetic excitation wave energy can be converted to propagating magnetic wave energy, the material being further adapted to receive an applied magnetic field in a way that results in a significant nonuniform internal field profile with appropriate field gradients. Means is provided to effect electromagnetic excitation of the magnetic material, the magnetic material and the means to effect electromagnetic excitation acting, in combination, to confine the electromagnetic excitation wave energy to a highly localized or small region relative to the physical dimensions of the magnetic material; the localized excitation, in combination with the nonuniform internal magnetic fields, acts to create naturally occurring modes of resonance of the magnetic material and, hence, propagating magnetic wave energy. The term "magnetic wave energy," as defined in the expression in column 9 of said U.S. Pat. No. 3,609,596, includes Zeeman, magnetic, exchange, magnetic anisotropy and electric components, and contains sufficient Zeeman energy so that the total magnetic wave is affected by field gradients.

The invention is hereinafter described with reference to the accompanying drawing in which.

Figure 5B:
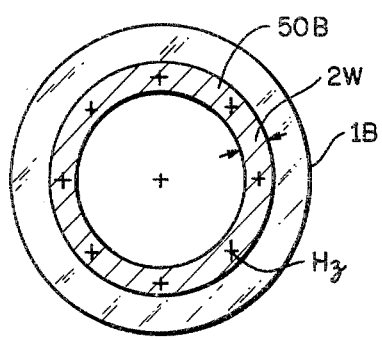
FIG. 5B is a top view of the slab of FIG. 5A, taken upon the lines 5B—5B in FIG. 5A and looking in the direction of the arrows, with a circular magnetic track represented diagrammatically.
Figure 5A:
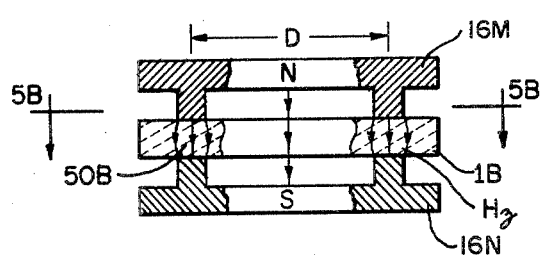
FIG. 5A shows, diagrammatically and partly cutaway, a thin slab of magnetic material between two pole pieces having specially shaped pole faces to induce a particularly-shaped, magnetic track in the slab.
Figure 8:
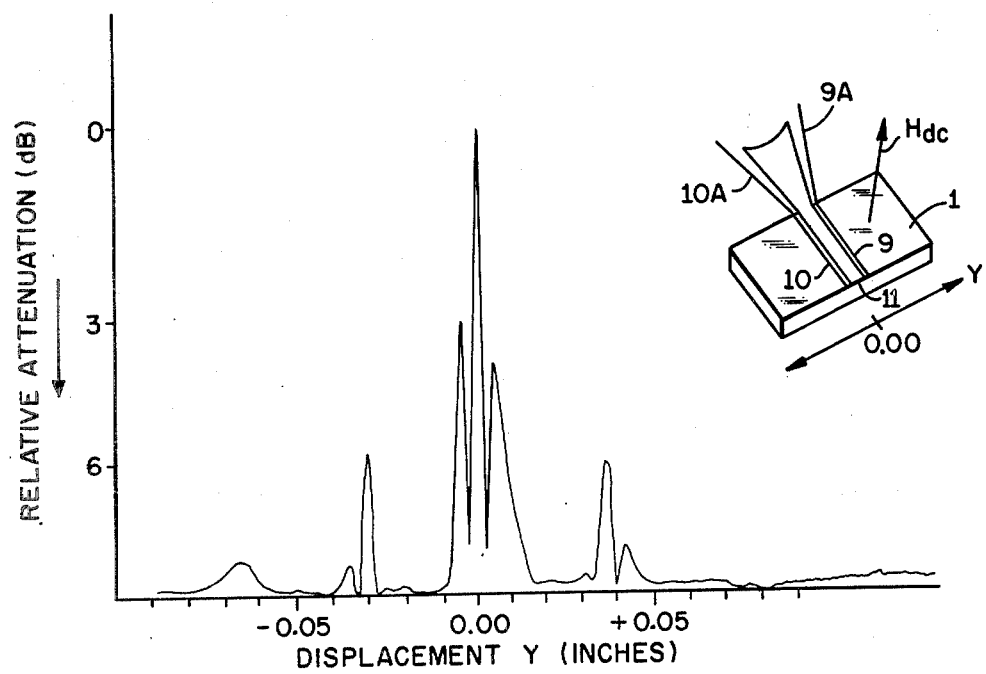
Figure 9A:
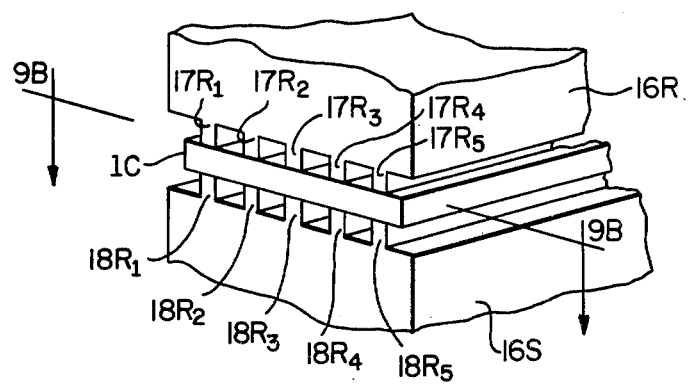
Figure 9B:
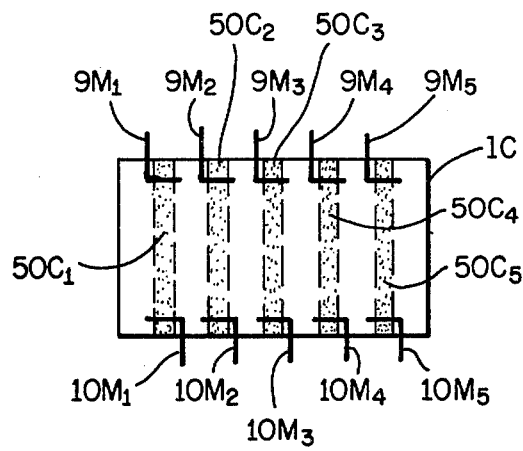
Figure 10:
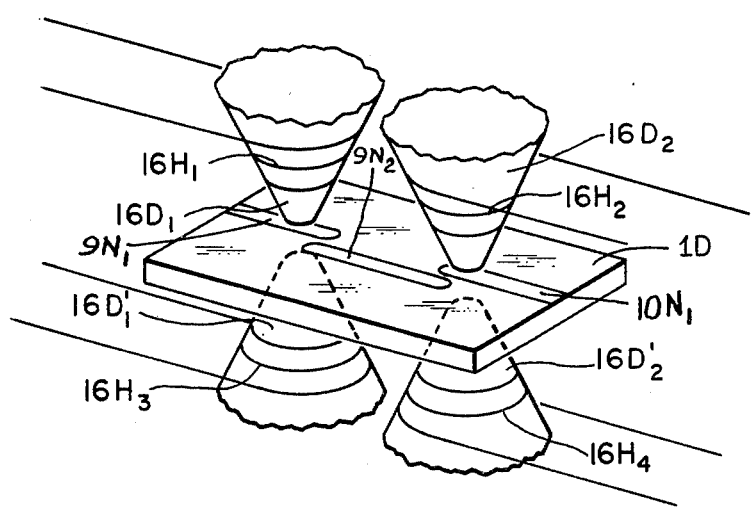

FIG. 8 contains a plot of measured microwave coupling vs. the position of input and output strip electrodes as a function of the displacement measured between the center line of the crystal slab shown as an inset in FIG. 8 and the center line of the strip electrodes;

FIG. 9A is an isometric view showing a magnetic slab, like the slab of FIG. 5A, except rectangular in cross dimensions, between two pole pieces adapted to provide a plurality of linear magnetic tracks within the slab;

FIG. 9B is a view, taken upon the line 9B—9B in FIG. 9A and looking in the direction of the arrows, and showing, diagrammatically, said linear magnetic tracks; and FIG. 10 is a schematic view showing, isometrically, a magnetic slab, like the slab of FIG. 9A, between four pole pieces adapted to provide a plurality of physically separated magnetized regions in the slab, each region being made to resonate separately or in conjunction with other regions.

Before discussing the specific apparatus of the figures, comments of a general nature are given in the next few paragraphs. Most of what immediately follows is taken from the Zeskind thesis.

The purpose of the work underlying said thesis was to continue the study of localized microwave magnetic resonance effects in non-ellipsoidal samples of yttrium iron garnet initiated by Olenberger and Morgenthaler (see C. F. Olenberger thesis entitled "Localized Resonance in Single Crystal Yttrium Iron Garnet," S.M. thesis, deposited in the M.I.T. library system Nov. 15, 1972. Using microwave integrated circuit techniques, an experimental three layer stripline antenna structure was constructed and was used to map precisely the spatially distributed microwave absorption properties of small rectangular slabs of single crystal and polycrystalline yttrium iron garnet (YIG). Initial efforts were devoted to measuring the absorption in transmission between parallel antennas on opposite sides of a crystal using a configuration similar to that used by said Olenberger and Morgenthaler. In this configuration, no important new results were obtained. However, while making these measurements, an unusually sharp resonance was observed in transmission between closely spaced parallel antennas on the same side of a normally magnetized rectangular YIG slab which was cut along the (110) plane. With crystal dimensions of 4.1 mm×4.8 mm×0.4 mm, antenna separation of 0.3 mm, and antennas located close to the middle of the crystal, this resonance was characterized by a half power bandwidth of 1.8 MHz at 2.5 GHz, an insertion loss at the center frequency of less than 10 db and a spatial linewidth of about 0.06 mm. Furthermore, the center frequency was tunable over the range 2.2 GHz to 3.0 GHz simply by changing the dc magnetic bias field.

Because of its unusually narrow frequency bandwidth, this surface coupling resonance (strong coupling between closely spaced parallel antennas on the same side of the crystal sample) proved interesting. Since the magnetic field was applied perpendicular to the crystal, a simple Damon-Eshbach (see a journal article entitled "Magnetostatic Modes of a Ferrimagnetic Slab," Damon et al, J. Phys. Chem. solids 19, 308, 1961) surface mode was initially ruled out as a possible cause of the observed resonance. As a next attempt to explain the observed resonance behavior, an isolated resonant cell model was proposed (similar to one considered by said Olenberger and Morgenthaler). It was thought that, due to the highly non-uniform internal magnetic fields present within the non-ellipsoidal ferrite sample, individual cells of uniform resonance might be induced. Measurements indicated, however, that as frequency or magnetic bias field was changed, the positions at which the resonances were observed did not change. Since the frequency of resonance is directly proportional to magnetic field, as external bias field changes, the position within the crystal at which a particular field magnitude is present will change. Therefore, the position at which a particular resonant cell is located should also change. To determine the expected change in position of the cells, a computer program was written to generate internal magnetic field profiles for the crystal samples. Internal magnetic field gradients were then calculated, and indicated that, if associated with the central regions of the crystal, the observed resonances should noticeably change position as the dc magnetic field changes by small amounts (1 to 10 Oersteds). This led to the conclusion that, if a resonant cell model were to fit the observed data, the resonant cells would have to be located very close to the edge of the crystal in regions of large internal field gradient.

Figure 4:
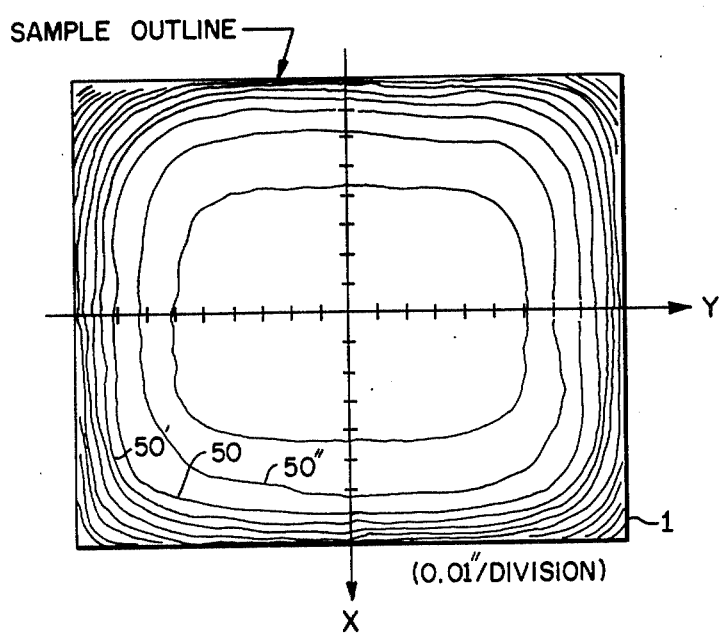
FIG. 4 is a diagrammatic representation showing a top view of a thin magnetic material slab, similar to the slab in FIG. 1, and showing contours of constant internal dc magnetic field within the slab when the slab is magnetized to saturation in a direction perpendicular to its major surfaces or similar contours may instead represent lines of constant internal dc magnetic field gradient.

In order to determine all locations within the crystal at which the internal fields are of appropriate magnitude to support resonance, contours of constant internal field magnitude were plotted; see FIG. 4 hereof. These contours of constant internal field form concentric paths about the center of the crystal. For a fixed contour interval (change in field between contours) the contours become very closely spaced toward the edges of the crystal (corresponding to increasing field gradient). After examining the shape and distribution of these contours, an alternate model for the localized resonance phenomenon was developed. Rather than considering isolated cells of resonance, it was realized that the constant field contours form natural tracks within the crystal which might possibly support some form of wave propagation. It was hypothesized that at some critical field gradient (at or near a particular constant field contour) a standing spin wave could be induced along the constant field track. Therefore, by locating the parallel surface antennas at positions of wave energy maxima along the track, power could be coupled into and out of the localized mode. Using the conceptually simple model of a standing wave, positions along the crystal at which maxima would occur were calculated. These positions corresponded reasonably well to positions at which maximum transmission between closely spaced parallel surface antennas was, indeed, observed. Furthermore, since the excited track is always located in a region of high internal field gradient, as the external field is changed slightly, the size of the resonant track changes only very slightly (for fixed frequency). Therefore, the positions of the standing wave maxima do not significantly change. This is consistent with the observed behavior. Using the standing wave concept along with the known dimensions of the track, an effective wave number, k, was calculated. For the lowest order standing wave mode, k, was determined to be approximately 9.0 cm$^{-1}$. Transient pulse response measurements indicate a propagation delay between the parallel surface antennas of about ten nanoseconds. Assuming direct propagation between antennas (with antenna separation of 0.3 mm), this corresponds to a possible group velocity of $3.3 \times 10^6$ cm/sec, much slower than the free space electromagnetic velocity and suitable as a means of creating time delay between the output and input signals. This gives support to a concept presently under development which would model propagation around the track as "Damon-Eshbach-like," whereby propagation would be along the surface of a wall of steep internal magnetic field gradient (also referred to herein as "internal apparent surface") present along the internal field tracks discussed above. The wall surface is parallel to the internal dc magnetic field and, therefore, propagation can be modeled as Damon-Eshbach-like, although vertical field gradients complicate the matter and may lead to "doubly confined modes."

The resonant track model, a "race track resonator," represents a simple conceptual approach to what otherwise would be an extremely difficult analytical problem. It has been used to predict successfully the locations of surface coupling resonances (resonances in transmission between parallel antennas on the same crystal surface) for two single crystal YIG slabs of different dimensions. Of still greater importance is the fact that the race track resonator concept is now being employed as the basis for a class of new, planar, tunable microwave filters of the type shown, for example, in FIG. 1 hereof to serve as an inexpensive replacement for presently available spherical type filters. Regardless of the precise nature of the resonant modes excited in the Zeskind experiments, the track concept is itself important, novel and can be forced to be valid in new configurations and devices. Indeed, an important factor in the present invention is the teaching that gradient confined or controlled modes can be created to serve the interests of the device engineer.

Figure 1:
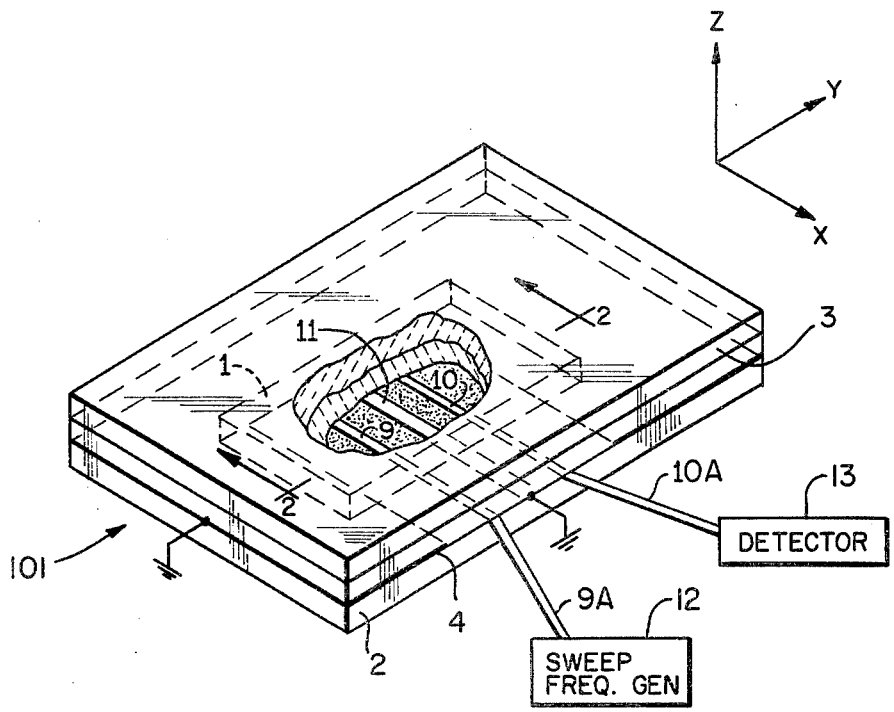
FIG. 1 is an isometric view, partly cutaway and partly block diagram in form, of an embodiment of the present invention and shows a thin slab of magnetic material as the internal element of a sandwich structure.
Figure 2:
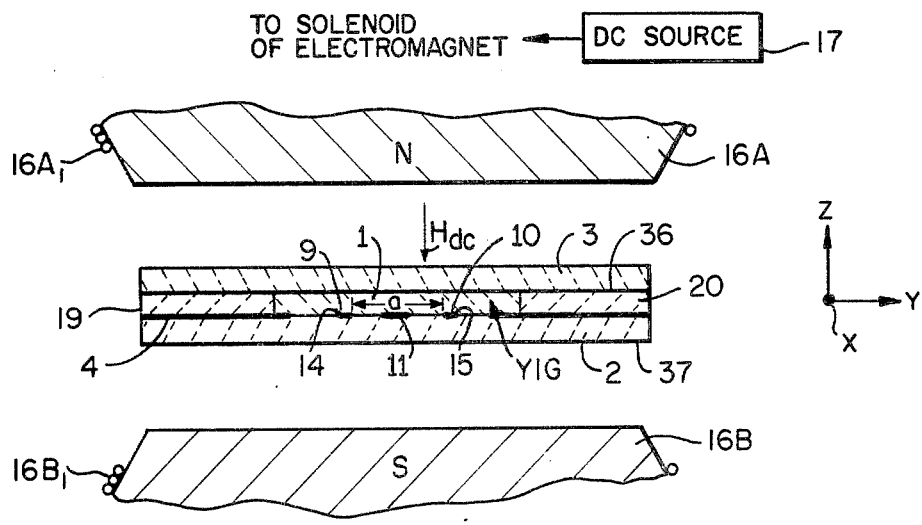
FIG. 2 is a section view taken upon the line 2—2 in FIG. 1 looking in the direction of the arrows and includes a diagrammatic representation of an electromagnet not shown in FIG. 1.
Figure 3:
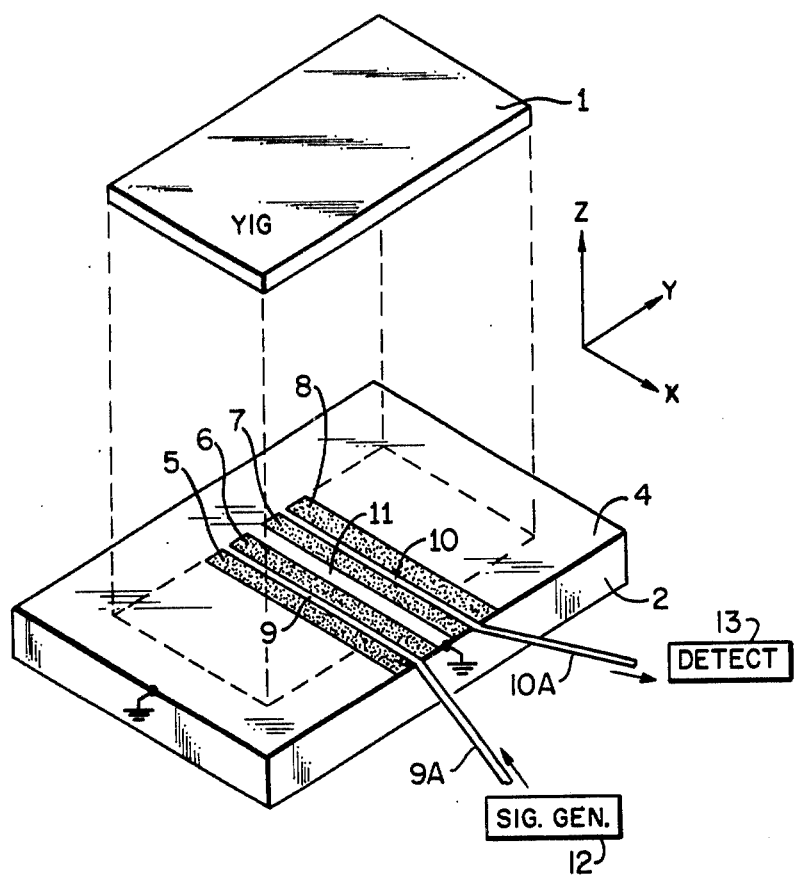
FIG. 3 is an isometric exploded view of a portion of the device of FIG. 1.

Turning now to the figures, the system or apparatus labeled 101 in FIG. 1 is adapted to filter wave energy and the particular apparatus shown in FIG. 1-3 is for use in connection with microwave, electromagnetic energy. The system 101 comprises a magnetic material 1 in FIG. 2, which in actual apparatus is a thin rectangularly shaped plate of YIG (a crystal that measured 4.8 mm×4.1 mm×0.4 mm was used as the primary crystal in the Zeskind thesis work because of availability, but other sizes were also used). The plate 1 is sandwiched between respective lower and upper dielectric plates 2 and 3 of alumina. The major exterior surfaces (i.e., the true surfaces) of the plates 1, 2 and 3 are substantially planar. The upper major surface of the alumina plate 2, as best shown in FIG. 3, contains a thin gold film 4 that covers the whole of the upper surface of the plate 2 with the exception of the portions marked 5, 6, 7 and 8. The thin strips marked 9 and 10 serve as electrodes or antennas in the system 101 and the grounded intermediate strip 11 serves as a shield between the electrodes or antennas 9 and 10. To place this explanation in some context, in actual apparatus, the strips 9, 10 and 11 traverse the crystal 1; the strips 9 and 10 are 0.025 mm wide, the ground strip 11 is 0.075 mm wide, and the separation between the electrodes 9 and 10, that is, the a dimension in FIG. 2, is a few hundred micrometers (0.32 mm in actual apparatus). There is a thin air gap between the strips 9, 10 and 11, which is the thickness of the strips, i.e., ~1-10 micrometers, typically. The electrodes 9 and 10 are parallel to one another, or at least have a component of each parallel to the other. The plates labeled 19 and 20 are alumina spacing plates. Substantial portions of the bottom of the plate 3 and of the plate 2 are covered by thin gold films 36 and 37, respectively, in FIG. 2.

Microwave electromagnetic energy from a sweep-frequency signal generator 12 is introduced through a coaxial cable 9A to the electrode 9 (which constitutes a first strip electrode at one location on the flat lower surface of the YIG crystal 1) that is operable to introduce the electromagnetic wave energy through the interface labeled 14 in FIG. 2 between the first electrode 9 and the magnetic material 1. The electrode 10 (which constitutes a second strip electrode herein and which is disposed at another location of the under surface of the crystal 1) is operable to extract electromagnetic wave energy through the interface labeled 15 in FIG. 2 between the second strip electrode 10 and the magnetic material 1. The wave energy propagates internally as magnetic wave energy within the single crystal material 1 between the region of the first electrode 9 and the second electrode 10. (The interfaces 14 and 15 are, of course, at the exterior surface of the crystal 1; this exterior surface, as is evident hereinafter, also serves as a surface of magnetic discontinuity as to propagating magnetic wave or spin wave energy within the crystal 1, but other surfaces such as, for example, the apparent internal magnetic surfaces induced, say, by appropriate shaping of pole pieces are referred to herein.)

Figure 7:
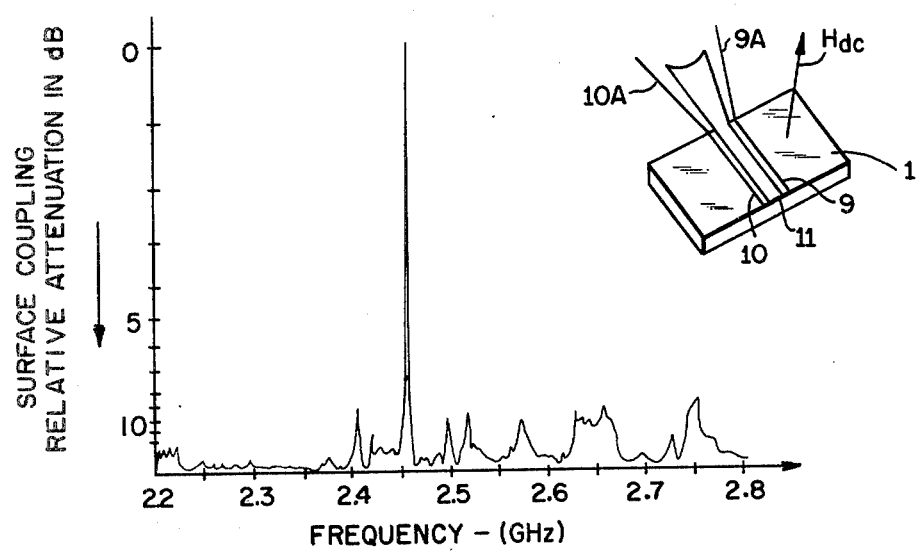
FIG. 7 is a plot of the measured microwave transmission through the experimental filter shown in the inset of FIG. 7 as a function of frequency for fixed applied magnetic field and fixed antenna position.

The strip electrodes 9 and 10 are separated from one another (i.e., the a dimension in FIG. 2) by a few hundred micrometers in the system of FIGS. 1-3; and it is such arrangement that achieved the performance depicted in FIGS. 7 and 8.

There is shown diagrammatically in FIG. 2 an electromagnet comprising pole pieces 16A and 16B and a source of dc current to energize the solenoids shown at $16A_1$ and $16B_1$ of the electromagnet. The magnetic field in the region occupied by the crystal 1 can be adjusted to change the center frequency of the filter.

Some general comments in this and the next few paragraphs apply to the apparatus 101 of FIG. 1 as well as to the further systems hereinafter described. The apparatus 101 is adapted to process (e.g., filter and/or delay as a function of frequency) electromagnetic wave energy.

The material that forms the slab 1 is a magnetic material that will support magnetic wave energy and is a material in which electromagnetic excitation wave energy can be converted to propagating magnetic wave energy. As is explained later, the magnetic material slab 1 receives or is located in an applied magnetic field which magnetizes the slab, usually to saturation; the applied magnetic field and the slab 1 interact to provide a significant internal magnetic field profile with appropriate field gradients. The nonuniform internal magnetic field profile serves two purposes in the present system: first, it serves, in combination with a masking effect provided by the electrodes 9 and 10 (and the film 4, generally) to confine the electromagnetic excitation wave energy to a highly localized or small region relative to the slab dimensions and, second, it serves to confine the propagating magnetic wave energy by regional localization, as later discussed. With reference to FIG. 2, for example, the electromagnetic excitation wave energy enters the crystal 1 through the exterior surface thereof around the interface 14 (The term "exterior surface" herein is used to denote a major surface, i.e., the upper or lower surfaces of the crystal 1 in FIGS. 1-3, but, conceptually, it could apply even to the edge surfaces of the crystal 1, and the adjective "exterior" is employed to distinguish such surfaces from apparent surfaces within the crystal formed, say, by inducing high field gradients in the manner hereinafter discussed with reference to FIG. 5A.). The excitation wave energy is confined to the small region within the crystal 1 just above and about the electrode 9 by the exterior surface of the crystal 1 in that region, by high magnetic field gradients within the crystal 1, as later discussed, and by masking. The magnetic wave evoked within the crystal 1 propagates along a track (as hereinafter discussed), and it also is constrained by the interface or exterior surface (e.g., the lower surface of the crystal 1) as well as a regional confinement due to high magnetic field gradients which provide apparent surfaces (i.e., internal magnetic surfaces) as to the magnetic wave energy, within the magnetic material slab 1. The various constraints upon the propagating magnetic wave energy are chosen to effect excitation in a way whereby surface scattering of the magnetic wave energy is minimized.

The designations 50, 50', 50" in FIG. 4 can each represent a close-loop magnetic track by which magnetic wave energy is guided, the contours 50, 50' . . . being places of either constant internal dc magnetic field or constant internal dc magnetic field gradient. The applied dc magnetic field in the contour map of FIG. 4 is about a 2300 Oersteds, and the contour interval is about one hundred Oersteds. The track, as above noted, is defined as the guiding or confining mechanism as to the mode energy. The latter may spread completely around a closed path or in certain cases may be confined to a portion thereof. In present terms each of the tracks 50, 50' . . . represents an internal apparent surface created by an effective magnetic discontinuity within the crystal 1 which results from a naturally occurring and significant nonuniform internal magnetic field when the crystal 1 is placed in a region of applied magnetic field $H_{dc}$, as shown, say, in FIG. 2. (Dopants, as later discussed, may be employed to change the shape of the tracks and the degree of the magnetic gradients.) The magnetic material 1, appropriately magnetized, and the means used to effect excitation thereof, that is, the antenna or electrodes 9 and 10, act, in combination, to confine the electromagnetic wave energy to a highly localized or small region relative to the external dimensions of the crystal 1; and such highly localized excitation, in combination with the internal magnetic fields, results in naturally occurring modes of resonance within the crystal whereby the magnetic wave energy is propagated within the crystal. A number of ways to create tracks within a crystal are disclosed later, but first there follows a discussion of some experimental results obtained in a system like that of FIG. 1, the results being those shown in the plots of FIGS. 7 and 8.

In FIG. 7, surface coupling of electromagnetic wave energy between the electrodes 9 and 10 in the inset crystal 1 with an applied field $H_{dc} = 2300$ Oersteds, is plotted as a function of frequency of the electromagnetic wave energy. The applied field $H_{dc}$ and the position of the electrodes 9 and 10 remain fixed for all readings.

In FIG. 8 there is plotted surface coupling of the electromagnetic wave energy between the electrodes 9 and 10, like the plot in FIG. 7, but in FIG. 8 the plot is with a fixed frequency, 2.461 GHz, and fixed magnetic field $H_{dc}$, 2300 Oersteds, the electrodes being moved to one side or the other of the 0.00 position in the inset crystal of FIG. 8. The plot of FIG. 8 shows that the transfer of energy to the material 1 and from the material 1 is sensitive to the translational position of the electrodes relative to the external surface of the material 1. The electrodes 9 and 10 used to obtain the plot in FIG. 8 were bound in fixed relationship to one another and hence were moved together as a unit.

Internal dc magnetic fields may be appropriately shaped by utilizing the naturally occurring geometry dependent fields, as described above and as shown in FIG. 4, for example, to provide a track or tracks along which magnetic excitations can propagate between input and output electrodes or antennas. Alternatively, external pole pieces, chemical doping, ion implantation or mechanical deformation of the crystal may be employed to give the required field profiles to provide said track or tracks. In terms of understanding the present concepts, it is believed that mechanical deformation as a way of forming a track affords the greatest possibility; such a track is shown at 50A in FIGS. 6A and 6B and is in the form of a circular groove of rectangular cross dimension cut into the magnetic crystal 1A to a depth d and having a mean diameter D. The groove width is 2W, and the crystal 1A is magnetized to saturation by an applied field $H_{dc}$, as shown. Coupling of electromagnetic wave energy to and from the crystal 1A is effected by an input electrode 9N that traverses the groove 50A at one location and an output electrode 10N that traverses the groove 50A at another location separated from the first location.

Figure 6A:
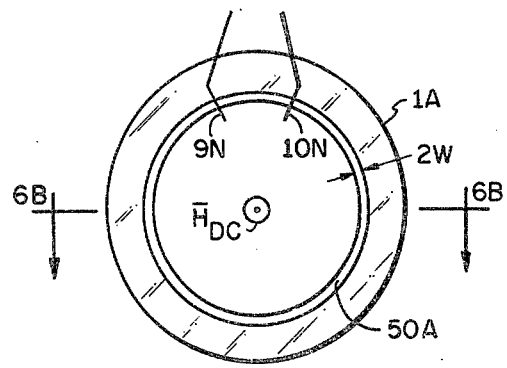
FIG. 6A shows a top view of a slab like the slab of FIG. 5A except having a groove to provide a track.
Figure 6B:
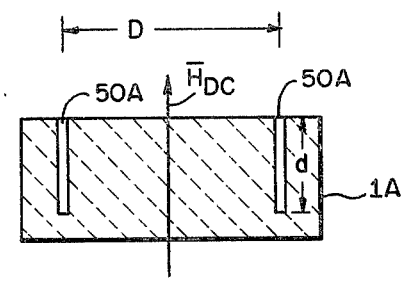
FIG. 6B is a view taken upon the lines 6B—6B in FIG. 6A, looking in the direction of the arrows.

As above noted, the groove 50A may be formed by mechanical removal of material (doping selected regions of the crystal may also be employed) in order to cause a variation in the saturation magnetization, magnetic anisotropy or both. If the track forms a closed path (as shown in FIG. 6A), magnetostatic patterns with wavelengths that are integer wave submultiples of the perimeter of the track can be excited resonantly. As a single concrete example, one can consider a circular track of width 2W and mean diameter $D >> 2W$ etched deeply ($d >> 2W$) into a ferrimagnetic substrate disc of saturation magnetization M that is magnetized normal to its plane, as shown in FIGS. 6A and 6B. Analysis by Morgenthaler reveals that surface modes guided by the walls of the track exist, and are resonant, provided $$\frac{(\alpha_n + \alpha_{on} \mu_\perp')^2 - k_n^2(\frac{K}{\mu})^2}{(\alpha_n - \alpha_{on} \mu_\perp')^2 - k_n^2(\frac{K}{\mu})^2} e^{-4\alpha_{on} W} \qquad (1)$$

where $$\alpha_n^2 = \alpha_{on}^2 + \omega_n^2 \mu_o \epsilon_o (1 - \epsilon' \mu_\perp')$$

$$k_n^2 = \omega_n^2 \mu_o \epsilon_o + \alpha_{on}^2 = (2n/D)^2 \quad n = 1,2,3 \ldots$$

$$\mu_\perp' = \frac{(\omega_z + \omega_M)^2 - \omega_n^2}{\omega_z(\omega_z + \omega_M) - \omega_n^2}$$

$$(\frac{K}{\mu})^2 = [\frac{\omega_M \omega_n}{\omega_z(\omega_z + \omega_M) - \omega_n^2}]^2$$

$$\omega_o = -\gamma \mu_o H_z$$

$$M = -\gamma \mu_o M,$$

wherein $H_z \approx H_{dc} - M$ and $\gamma$ is the gyromagnetic ratio (negative) for electrons.

If the modes satisfy fully the magnetostatic approximation, $$\alpha_n^2 \approx \alpha_{on}^2 \approx k^2$$

then, Eq. (1) simplifies to $$\omega_n^2 = (\omega_z + \tfrac{1}{2}\omega_M)^2 - \tfrac{1}{4}\omega_M^2 e^{-8Wn/D} \qquad n = 1,2,3 \ldots \qquad (2),$$

and the wave propagation becomes similar to that considered by Tsutsumi (See "Magnetostatic surface wave propagation through the Air Gap Between Adjacent Magnetic Substrates," *Proc. IEEE* (Let.) 62, 541, 1975), except that Tsutsumi did not consider a curved or closed path nor did he consider discrete modes. However, it should be emphasized that the full magnetostatic limit is by no means assured for low order n since $-\mu'$ may be large enough so that $\alpha^2 \neq \alpha_o^2$ and hence $\alpha^2 \neq k^2$. It should be noted that frequencies depend upon the W/D ratio, therefore the tracks of different diameter can be adjusted to have the same frequency. Energy coupling between degenerate modes guided by tracks concentric to one another is of special interest and can occur because magnetic wave energy exists in the regions of crystal adjacent to the track and not merely within the width 2W.

The group velocities of the surface waves circulating on such tracks are approximately given by $$(v_g)_n = \omega_M^2 / 2\omega_n w e^{-8Wn/D} \tag{3}$$

Table I below lists the predicted resonant frequencies and group velocities of a D=3.0 mm, 2W=0.1 mm track and a D=3.0 mm, 2W=0.3 mm track, both in a YIG substrate ($\omega_M \approx \pi \times 10^{10}$ rad/sec) magnetized so that $\omega_z \approx 1.4\pi \times 10^9$ rad/sec.

Table I

| D = 3mm 2W = .1mm | | |
|---|---|---|
| n | $\omega_n/2\pi$(MHz) | $(v_g)_n$ cm/sec. |
| 1 | 2184 | $1.57 \times 10^8$ |
| 2 | 2335 | $1.29 \times 10^8$ |
| 3 | 2460 | $1.07 \times 10^8$ |
| 4 | 2564 | $8.99 \times 10^7$ |
| 5 | 2652 | $7.60 \times 10^7$ |
| 6 | 2726 | $6.47 \times 10^7$ |
| D = 3mm 2W = .3mm | | |
| n | $\omega_n/2\pi$(MHz) | $(v_g)_n$ cm/sec. |
| 1 | 2460 | $3.21 \times 10^8$ |
| 2 | 2726 | $1.94 \times 10^8$ |
| 3 | 2891 | $1.23 \times 10^8$ |
| 4 | 2996 | $7.94 \times 10^7$ |
| 5 | 3065 | $5.20 \times 10^7$ |
| 6 | 3110 | $3.44 \times 10^7$ |

The surface of the single crystal 1A in FIGS. 6A and 6B is highly polished (i.e., to about one micrometer or better), as are also the inside surfaces of the track 50A. It should be emphasized that if the track slots are filled with a magnetic material having different parameters (anisotropy, magnetization, etc.) entirely new modes can exist for this, or other, magnetic field directions.

Figure 5C:
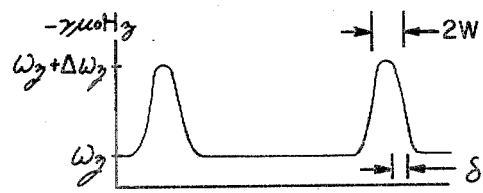
FIG. 5C is a graphic representation of internal magnetic field strengths in the slab of FIG. 5A as a function of lateral location across the slab.

As above indicated, another alternate procedure is to employ regions of higher (or lower) magnetic field to create tracks such as that shown in FIGS. 5A and 5B wherein the circular disc shown at 1B is like the magnetic material 1 of FIG. 1 and pole pieces (to magnetize the disc 1B to saturation) are labeled 16M and 16N. The dimension D and 2W have the same significance as like designations in FIGS. 6A and 6B; the magnetically-induced track in FIGS. 5A and 5B is labeled 50B. If the fringing width δ in FIG. 5C between field levels satisfies δ<<(D/2n) for all integers n that are of interest, δ can be approximated as zero. Then, a simplified approximate analysis (subject to the previous critique concerning the validity of the magnetostatic approximation) predicts two sets of surface-like modes with frequencies given by $$\omega_n^2 = \omega_z(\omega_z + \omega_M) + (\omega_z + \tfrac{1}{2}\omega_M)\Delta\omega_z + \tfrac{1}{2}\Delta\omega_z^2 \\ \pm \tfrac{1}{2}\Delta\omega_z \sqrt{(2\omega_z + \omega_M + \Delta\omega_z)^2 - \omega_M^2(1 - e^{-8Wn/D})} \tag{4}$$

where $\omega_z$ and $\omega_z + \Delta\omega_z$ correspond to the non-track and track regions; $\Delta\omega_z$ may be positive or negative. The lower set of frequencies correspond to forward-wave propagation; the higher set to backward-wave propagation. The group velocities are approximately given by $$(v_g)_n = \frac{(\mp \Delta\omega_z \omega_M^2 W e^{-8Wn/D})}{2\omega_n \sqrt{(2\omega_z + \omega_M + \Delta\omega_z)^2 - \omega_M^2(1 - e^{-8Wn/D})}} \tag{5}$$

It will be noted that the "surfaces" of the track 50B are the regions of high gradient and unlike a true surface (i.e., an exterior surface) would not suffer from mechanical imperfections, etc. Moreover, the track diameter D and the width 2W of the track 50B could obviously be altered by magnetic control. With respect to the track 50B (as well as the tracks 50, etc.) the mode pattern or patterns may consist of waves circulating in a clockwise or a counter-clockwise direction or a combination thereof; the propagation characteristics of each may be alike or dissimilar.

There now follows a discussion of quality factors associated with the localized modes herein disclosed. It is well known that the natural decay of energy stored in a resonance mode of frequency $\omega_0$ is given by $e^{-2\omega_0 t/Q^{temporal}}$, where $$Q_{temporal} = \frac{\omega_0 \text{ (ave. stored energy)}}{\text{(ave. dissipated power)}}, \tag{6}$$

the temporal Q of the resonance.

If the stored energy is associated with a wave that propagates at an energy velocity equal to the group velocity, $(v_g)_i = \partial\omega/\partial k_i$, the decay rate of the wave energy with position (x) is $$e^{-2\omega_0 x/Q_{temporal} v_g} = e^{-2\alpha x}$$

Therefore, the spatial Q of the wave, $Q_{spatial}$, defined by $k/\alpha$ is related to $Q_{temporal}$ by $$Q_{spatial} = Q_{temporal}[(k \, v_g)/\omega_0]. \tag{7}$$

For nondispersive waves, $kv_g = \omega_0$ and the Qs are equal; however for the dispersive magnetostatic waves under consideration, the $Q_{spatial}$ is generally much lower. Nevertheless, the highly localized spatial excitation of the high temporal Q modes reported in the Zeskind thesis implies that $Q_{spatial}$ is substantial and with appropriate mode tailoring can probably be increased further. Such considerations are important because they impact upon the design of multipole filters and those with closely spaced input and/or output lines that might be used to process many frequency channels separately; see the explanation below with reference to FIGS. 9A, 9B and 10.

The magnetic element labeled 1C in FIGS. 9A and 9B comprises a plurality of linear tracks $50C_1$, $50C_2$ ... in FIGS. 9B to which electromagnetic wave energy is coupled in by input electrodes $9M_1$, $9M_2$ ... and coupled out by suitable output electrodes $10M_1$, $10M_2$ ... ; input can be at $9M_1$ for example, and the output can, but need not be, the electrode $10M_1$. Such output can be taken from $10M_2$ ..., provided the internal magnetic modes patterns overlap so as to provide internal coupling between tracks or regions. The tracks $50C_1$, $50C_2$ ... are induced in the crystal 1C by pole pieces 16R and 16S whose pole faces are notched to provide the facing and interacting teeth labeled $17R_1$–$18R_1$, $17R_2$–$18R_2$ ... The tracks $50C_1$, $50C_2$ ... serve to effect regional confinement of magnetic wave energy at a plurality of separated regions of the crystal 1C. The electrode pairs $9M_1$–$10M_1$ ... serve as antenna units to introduce electromagnetic wave energy to the associated track region of the magnetic crystal 1C and to withdraw electromagnetic wave energy from the associated track region. In this way, a plurality of such regions are supplied by one crystal, that is, the crystal 1C can serve to process electromagnetic wave energy at more than one frequency or to process more than one signal at the same frequency; and a single track or region may support more than one resonant mode, that is, create two or more resonant frequencies. And, of course, the tracks $50C_1$ ... can be grooves or take the other forms herein disclosed.

The tracks or regions of resonance may be elongate, but they may be localized volumes or resonant cells such as, by way of illustration, shown in FIG. 10 wherein the resonant cells are the volumes in the magnetic crystal labeled 1D respectively between the pole faces of a pole pair $16D_1$—$16D_1'$ and a pole pair $16D_2$—$16D_2'$. The poles $16D_1$ . . . are energized to produce a dc magnetic field as before, by coils $16H_1$ . . . . The resonant regions may be connected to each other and to outside circuitry using metallized areas $9N_1$ and $10N_1$ which constitute input-output electrodes; a metallized area $9N_2$ couples wave energy between the localized volumes or resonant cells referred to previously in this paragraph.

If it is desired to force certain waves or modes with specific characteristics to be supported in a magnetic crystal, it is necessary to understand factors which strongly affect magnetic wave energy parameters, namely, frequency, group velocity or velocity of energy propagation, spatial distribution, and attenuation factors. The above examples relate to specific cases; however, somewhat more general considerations governing magnetostatic waves provided or guided by dc field gradients, now follow.

The discussion in this and the next few paragraphs relates to the conditions necessary to cause a magnetostatic wave to be bound or confined by a dc magnetic field gradient located near the exterior surface of a half space of ferrimagnetic crystal when the wave propagation is both parallel to the exterior surface and perpendicular to the dc field direction; but other directions of propagation and/or field orientation may be handled by similar means. General equations which govern the eigenmode potential are developed below as are expressions that allow evaluation of the group velocity and wave attenuation factor. However, there is also given a very special family of field gradients that, at a special point of the dispersion diagram, allow analytic expressions to be found for the mode profile and phase and group velocities.

By proper choice of the gradient, the bound wave frequencies and the ratio of the wave energy inside the crystal to that outside can be controlled. As expected, the waves are nonreciprocal with respect to propagation direction; but in contrast to the Damon-Eshbach mode (propagating in the absence of a field gradient), solutions exist for both directions of propagation.

First, there is considered a ferrimagnetic crystal half space magnetized to saturation in the z-direction, as before, by a dc field $H_z(x)$ which is assumed to predominate over the transverse component that is required to be non-zero because $\nabla \times \bar{H} = 0$. The origin of the x-axis is taken at the air-crystal interface with the air half space occupying $x<0$.

Magnetostatic wave propagation at a frequency $\omega$ is assumed to be along the y axis, as before; the associated complex magnetic scalar potential is of the form $$\psi = e^{\int p(x)dx} e^{j(\omega t - ky)} \quad (8)$$

where $\omega > 0$ and k are constant. For $x > 0$, the function $p(x)$ must satisfy $$\frac{dp}{dx} = k^2 - p^2 + \frac{(Z^2 + \Omega^2)p + 2Z\Omega k}{(Z^2 - \Omega^2)(Z^2 + Z - \Omega^2)} \frac{dZ}{dx}, \quad (9)$$

where for the convenience the normalized quantities $Z = H_z/M$ and $\Omega = \omega/-\gamma\mu_0 M$ are introduced with M the saturation magnetization and $+\gamma$ the gyromagnetic ratio. For $x<0$, $p(x) = |k|$; therefore, the surface boundary condition ($b_x$ continuous) is $$p(0+) = \frac{[Z(0)^2 - \Omega^2]|k| - \Omega k}{Z^2(0) + Z(0) - \Omega^2}. \quad (10)$$

Other boundary conditions such as afforded by metallized surfaces ($b_x = 0$) or other surface treatments can be employed. In such cases, Eq. (10) is replaced by its counterpart and mode character (frequency, group velocity, and surface) is thereby altered. Eigenpairs $\Omega$, k that satisfy Eq. (10) and yield solutions of Eq. (9) with the property $p(\infty)<0$ form the dispersion relation. The group velocity $v_g$ can be evaluated either from the slope of the $\omega(k)$ diagram or from the integral expression $$v_g = \frac{2\omega \int_{-\infty}^{+\infty} [Kp - (1+\chi)k]\psi^*\psi dx}{\int_{-\infty}^{+\infty} \{(p^2 + k^2)[1 + Z(\chi^2 + K^2)] - 4pkZ\chi K\}\psi^*\psi dx}, \quad (11)$$

where $\chi = Z/(Z^2 - \Omega^2)$ and $K = \Omega/(\Omega^2 - Z^2)$ are the components of the lossless Polder susceptibility tensor and magnetic anisotropy is neglected for the sake of simplicity. The attenuation factor $\alpha$ of the mode is approximately $$\alpha = \frac{\int_{-\infty}^{+\infty} \omega \Delta H |(p^2 + k^2)[\chi - Z(\chi^2 + K^2)] + 2pkK(2Z\chi - 1)|\psi^*\psi dx}{2\omega \int_{-\infty}^{+\infty} [Kp - (1+\chi)k]\psi^*\psi dx}. \quad (12)$$

Although numerical methods are required for the general case, there is a very special family of field profiles $Z(x)$ that allow an analytic treatment of certain $\Omega$, k pairs. In the event that within the crystal $$\left|\frac{Z^2 + Z - \Omega^2}{Z^2 - \Omega^2}\right|^{-q} \left|\frac{Z - \Omega}{Z + \Omega}\right| \left|\frac{2Z + 1 + \sqrt{1 + 4\Omega^2}}{2Z + 1 - \sqrt{1 + 4\Omega^2}}\right|^{\frac{2\Omega}{\sqrt{1 + 4\Omega^2}}} = Ce^{(q^2 - 1)(kx)}, \quad (13)$$

where C and q are constants, the solution of Eq. (9) is $p = qk$; of $p \leq 0$, a bound mode results. For $k>0$, this requires $(\sqrt{1 + 4\Omega^2} - 1)/2 < Z(0) < \sqrt{\Omega^2 + \Omega}$. If in addition, $Z(0) < \Omega$, $-p > |k|$, whereas for $Z(0) > \Omega$, $-p < |k|$. For $k<0$, the requirement is $Z(0) < (\sqrt{1 + 4\Omega^2} - 1)/2$ and $$Z(0) > \begin{cases} 0 & \Omega \leq 1 \\ \sqrt{\Omega^2 - \Omega} & \Omega > 1 \end{cases}.$$

If, in addition, $Z(0) \leq \Omega - \frac{1}{2}$, $-p < |k|$; whereas, for $Z(0) > \Omega - \frac{1}{2}$, $-p > |k|$. The special case of zero field gradient is included since $q^2 = 1$ occurs when $\Omega$ equals the Damon-Eshbach limit, $Z(0)+\frac{1}{2}$; in that limit $v_g=\omega_M(d\Omega/dk)=0$.

Although the group velocity can be found from Eq. (11), an alternate treatment leads directly to $$v_g = \frac{\omega_M}{|k|} \frac{(Z(0)^2-\Omega^2)[1+2(Z(0)+\Omega \frac{k}{|k|})][(Z(0)+\Omega \frac{k}{|k|})^2+\Omega \frac{k}{|k|}]}{\left\{ (Z(0)^2-\Omega^2)[1+2(Z(0)+\Omega \frac{k}{|k|})]^2 + 2[(Z(0)+\Omega \frac{k}{|k|})^2+\Omega \frac{k}{|k|}][3\Omega^2+(2Z(0)+1)\Omega \frac{k}{|k|} -Z(0)^2] \right\}} \quad (14)$$

There are tabulated in Table II below, for illustrative purposes, the mode parameters for several different Eq. (13) profiles; in all cases $\Omega=1$.

TABLE II

| C | q | k/\|k\| | Z(0) | Z'(0)/\|k\| | \|k\|dΩ/dk |
|---|---|---|---|---|---|
| .584 | −.341 | +1 | 1.2 | −.407 | .196 |
| $1.37\times10^{-3}$ | −7.95 | +1 | .7 | .577 | −.308 |
| $2.62\times10^3$ | 3.09 | −1 | .57 | −.116 | −.087 |
| 3.97 | .364 | −1 | .4 | .263 | .079 |

It will be noticed in Table II that the surface field gradients span a factor of five; the corresponding group velocities a factor of 3.5 (neither factor is limiting). For both directions of propagation, it is seen that $|p|/|k|$ can be made greater or less than unity.

The value of the foregoing analysis rests on its ability to help model more complex situations and to provide estimates of those field parameters required to force waves to propagate in desired frequency ranges and with the desired velocities.

Brief mention is made herein of the use of the present devices to perform signal processing functions other than simple band-pass filtering. Delay line functions can be provided using suitable tracks along which wave energy travels at slow speeds compared to the velocity of light. Such paths can be formed, say, along spiral or helical configurations.

On another matter, for those situations in which the track propagation is non-reciprocal, such propagation can be employed to fashion novel types of no-reciprocal devices such as circulators, isolators, non-reciprocal phase shifters and the like.

A few comments of a general nature are included in this paragraph. Regional confinement of the propagating wave energy is effected in the system described here by a track in the form of forced magnetic field gradient within the magnetic material (e.g., FIG. 5A) or a natural magnetic field gradient within the material (e.g., FIGS. 1–3) or a doped region (e.g., gallium or other atomic species leading to a local reduction or an increase in the saturation magnetization) within the magnetic material or a groove at the exterior surface of the material or a combination thereof. The exterior surface of the magnetic material is highly polished (i.e., the order of one micrometer or better) to prevent losses but may be selectively roughened to provide selected lossy areas to effect the propagating magnetic wave energy. Similarly, selected portions of the magnetic material can be doped by said solid state diffusion or ion implantation with, for example, rare earths or other "rapid relaxers" to suppress superfluous or undesirable modes of propagating magnetic wave energy or the exterior surface of the material can be selectively masked, as noted below, for the same purpose. Also, the input and output electrodes need not be at the same side of the slab.

Masks are used herein to serve two purposes: first, masks, such as the electrodes 9 and 10 and the ground plane 4 in FIGS. 1–3, are used to effect electromagnetic input and output and, moreover, in conjunction with the dc magnetic field gradients and sample boundaries, to help create the spatially localized modes of resonance used to process wave energy; second, masks which serve to suppress or attenuate unwanted modes. These masks can take the form of highly conducting metallic films, dielectric films, magnetic films, absorptive films. The masks may act to alter magnetic field profiles, as well, and multiple masks may be used.

Further modifications of the invention herein disclosed will occur to persons skilled in the art and all such modifications are deemed to be within the scope of the invention as defined by the appended claims.

What is claimed is:

1. Apparatus for processing electromagnetic wave energy, that comprises, a gyromagnetic material capable of converting electromagnetic excitation wave energy to magnetic wave energy therein, means for exciting the gyromagnetic material with electromagnetic wave energy for conversion to magnetic wave energy in the material, means for applying a magnetic field to the gyromagnetic material and creating therein a non-uniform internal magnetic field profile having a predetermined magnetic field gradient sufficient to confine magnetic wave energy in the material to at least one localized region of the gyromagnetic material that has a dimension that is small relative to the corresponding dimension of the material, and means for extracting from the gyromagnetic material electromagnetic wave energy that has been proposed as the result of the confinement of the magnetic wave energy in the gyromagnetic material.

2. Apparatus as claimed in claim 1, wherein the means for applying a magnetic field and creating a non-uniform magnetic field profile confines magnetic wave energy in the gyromagnetic material to at least one localized region of magnetic wave energy resonance.

3. Apparatus as claimed in claim 1, wherein the means for applying a magnetic field and creating a non-uniform magnetic field profile confines magnetic wave energy in the gyromagnetic material to propagation along at least one localized path in the gyromagnetic material.

4. Apparatus as claimed in claim 1, wherein the magnetic field applying means has a configuration that forces the creation of the non-uniform internal magnetic field profile.

5. Apparatus as claimed in claim 1, wherein the means for applying a magnetic field and creating a non-uniform magnetic field profile comprises at least one magnetic discontinuity in the material.

6. Apparatus as claimed in claim 5, wherein the discontinuity is a natural discontinuity in the gyromagnetic material.

7. Apparatus as claimed in claim 5, wherein the discontinuity is formed by a dopant in the gyromagnetic material.

8. Apparatus as claimed in claim 5, wherein the discontinuity comprises a surface extending internally of the gyromagnetic material.

9. Apparatus as claimed in claim 8, wherein the surface defines a groove in the gyromagnetic material.

10. Apparatus as claimed in claim 9, wherein the groove has approximately rectangular cross-sectional configuration.

11. Apparatus as claimed in claim 10, wherein the depth of the groove is greater than its width.

12. Apparatus as claimed in claim 9, wherein the exterior surface and the groove surface of the gyromagnetic material are highly polished.

13. Apparatus as claimed in claim 9, wherein the groove forms a closed loop and the exciting and extracting means are coupled to circumferentially spaced portions of the groove.

14. Apparatus as claimed in claim 5, wherein the discontinuity defines a track for guiding magnetic wave energy.

15. Apparatus as claimed in claim 14, wherein the track is a closed loop.

16. Apparatus as claimed in claim 15, wherein the exciting means and the extracting means are strip electrodes disposed in close proximity to the exterior surface of the gyromagnetic material and extending across the track.

17. Apparatus as claimed in claim 15, wherein the exciting means produces magnetic wave energy along the track with a wave length that is a submultiple of the perimeter of the track.

18. Apparatus as claimed in claim 14, wherein the exciting means and the extracting means are coupled to spaced regions of the track.

19. Apparatus as claimed in claim 5, there being a plurality of said magnetic discontinuities.

20. Apparatus as claimed in claim 19, wherein each discontinuity defines a track for guiding magnetic wave energy.

21. Apparatus as claimed in claim 1, wherein the exciting means produces magnetic wave energy that propagates in the gyromagnetic material with minimal surface scattering.

22. Apparatus as claimed in claim 1, wherein the exciting means produces magnetic wave propagation in the gyromagnetic material that is non-reciprocal.

23. Apparatus as claimed in claim 1, wherein the exciting means produces magnetic wave propagation in the gyromagnetic material having a pedetermined propagation direction and group velocity.

24. Apparatus as claimed in claim 1, wherein the exciting means and the extracting means comprise first and second parallel strip electrodes, respectively, disposed at the same side of the gyromagnetic material.

25. Apparatus as claimed in claim 24, wherein the electrodes are separated from one another by no more than of the order of a few hundred micrometers.

26. Apparatus as claimed in claim 24, wherein a grounded strip is interposed between the electrodes.

27. Apparatus as claimed in claim 1, wherein the exciting means and the extracting means comprise electrode means substantially at the exterior surface of the gyromagnetic material and wherein the efficiency of energy transfer to and from the gyromagnetic material is very sensitive to the position of the electrode means relative to said external surface.

28. Apparatus as claimed in claim 1, wherein the exciting means excites the gyromagnetic material with electromagnetic wave energy having a predetermined frequency spectrum and wherein the extracting means extracts electromagnetic wave energy having a different frequency spectrum resulting from the confinement of magnetic wave energy in the gyromagnetic material.

29. Apparatus as claimed in claim 1, wherein the means for applying a magnetic field and creating a non-uniform magnetic field profile confines magnetic wave energy in the gyromagnetic material to at least one localized region of magnetic wave energy resonance, and wherein the magnetic wave energy resonance in the gyromagnetic material is sufficient to provide a high-Q filter between the exciting means and the extracting means.

30. Apparatus as claimed in claim 1, wherein the magnetic field applying means magnetizes the gyromagnetic material to saturation.

31. Apparatus as claimed in claim 1, wherein the means for applying a magnetic field and creating a non-uniform magnetic field profile confines magnetic wave energy in the gyromagnetic material to a plurality of localized physically separated regions of the material.

32. Apparatus as claimed in claim 31, wherein the exciting means and the extracting means comprise input and output electrodes at each of the physically separated regions.

33. Apparatus as claimed in claim 1, wherein the means for applying a magnetic field and creating a non-uniform magnetic field profile confines magnetic wave energy in the gyromagnetic material to a plurality of physically separated localized regions of magnetic wave energy resonance.

34. Apparatus as claimed in claim 1, wherein the gyromagnetic material has non-ellipsoidal geometry.

35. Apparatus as claimed in claim 1, wherein the gyromagnetic material comprises a rectangular slab.

36. Apparatus as claimed in claim 1, wherein the gyromagnetic material is a single crystal YIG.

37. Apparatus as claimed in claim 1, wherein the gyromagnetic material is highly polished at at least selected parts of its exterior surface.

38. Apparatus as claimed in claim 1, wherein the means for applying a magnetic field and creating a non-uniform magnetic field profile confines the magnetic wave energy to regions at or near the exterior surface of the gyromagnetic material.

39. Apparatus as claimed in claim 1, wherein the exterior surface of the gyromagnetic material has predetermined lossy areas affecting the propagation of magnetic wave energy.

40. Apparatus as claimed in claim 39, wherein the lossy areas are roughened to render them lossy.

41. Apparatus as claimed in claim 1, wherein the gyromagnetic material has means for suppressing undesired modes of propagating magnetic wave energy.

42. Apparatus as claimed in claim 41, wherein the suppressing means comprises a dopant.

43. Apparatus as claimed in claim 35, wherein the suppressing means comprises a mask.

44. Apparatus as claimed in claim 1, wherein the gyromagnetic material is a single crystal thin film.

45. Apparatus as claimed in claim 1, wherein the gyromagnetic material is a single crystal thick film.

46. Apparatus as claimed in claim 1, wherein the gyromagnetic material is polycrystalline.

47. Apparatus for processing electromagnetic wave energy, that comprises, a gyromagnetic material capable of converting electromagnetic excitation wave energy to magnetic wave energy therein, means for introducing electromagnetic excitation wave energy to the gyromagnetic material for conversion to magnetic wave energy in the material, means for applying a magnetic field to the gyromagnetic material and creating therein a non-uniform internal magnetic field profile having a predetermined field gradient sufficient to control at least one magnetic wave energy parameter in the gyromagnetic material by field gradient confinement of magnetic wave energy in the material to at least one localized region of the gyromagnetic material having a dimension that is small relative to the corresponding dimension of the material, and means for extracting from the gyromagnetic material electromagnetic wave energy that has been processed as the result of the control of said parameter in the gyromagnetic material.

48. A method of processing electromagnetic wave energy utilizing a gyromagnetic material capable of converting electromagnetic excitation wave energy to magnetic wave energy therein, which comprises introducing electromagnetic excitation wave energy to the gyromagnetic material and converting that wave energy to magnetic wave energy in the material, applying a magnetic field to the gyromagnetic material and creating therein a non-uniform internal magnetic field profile having a predetermined field gradient sufficient to control at least one magnetic wave energy parameter in the gyromagnetic material by field gradient confinement of magnetic wave energy in the material to at least one localized region of the gyromagnetic material having a dimension that is small relative to the corresponding dimension of the material, and extracting from the gyromagnetic material electromagnetic wave energy that has been processed as the result of the control of said parameter in the gyromagnetic material.

49. A method as claimed in claim 48, wherein the field gradient confinement confines magnetic wave energy to at least one localized region of magnetic wave energy resonance.

50. A method as claimed in claim 49, further comprising adjusting the applied magnetic field to adjust the frequency of the resonance.

51. A method as claimed in claim 48, wherein the field gradient confinement confines magnetic wave energy to propagation along at least one localized path.

52. A method as claimed in claim 48, wherein the introduction of electromagnetic excitation wave energy is restricted to a localized region of the gyromagnetic material.

53. A method as claimed in claim 48, wherein the magnetic wave energy propagation is two dimensional and in which magnetic wave energy parameters are interrelated to the magnetic field gradient by an expression of the type $$\frac{dp}{dx} = k^2 - p^2 + \frac{(Z^2+\Omega^2)p + 2Z\Omega k}{(Z^2-\Omega^2)(Z^2Z-\Omega^2)} \cdot \frac{dZ}{dx},$$

in an x-y-z local coordinate system defined so that the local direction of magnetic wave propagation is in the y-direction and in which the wave pattern within the gyromagnetic material is substantially independent of the coordinate z; where $Z=H_z/M$ is the z-component of the internal magnetic field normalized to the saturation magnetization; $\Omega=\omega/\omega_M$, where $\omega$ is the radian frequency of the magnetic wave energy, $\omega_M=-\gamma\mu_o M$, where $\gamma$ is the gyromagnetic ratio which is negative for electrons, $\mu_o=4\pi\times 10^{-7}$ Henries/meter; k is the wavenumber of the magnetic wave energy, $k=(2\pi/\lambda)$, where $\lambda$ is the wavelength at the position x; and p(x) describes the x variation of the magnetostatic potential exponential $(\int p(x)dx)$.

* * * * *